United States Patent
Göltl et al.

(10) Patent No.: US 6,833,284 B2
(45) Date of Patent: Dec. 21, 2004

(54) METHOD FOR SUBDIVIDING WAFERS INTO CHIPS

(75) Inventors: Claudia Göltl, Schwandorf (DE); Frank Kuhn, Munich (DE)

(73) Assignee: Osram Opto Semiconductors GmbH, Regensburg (DE)

(*) Notice: Subject to any disclaimer, the term of this patent is extended or adjusted under 35 U.S.C. 154(b) by 0 days.

(21) Appl. No.: 10/466,569

(22) PCT Filed: Jan. 16, 2002

(86) PCT No.: PCT/DE02/00108

§ 371 (c)(1), (2), (4) Date: Jan. 20, 2004

(87) PCT Pub. No.: WO02/056365

PCT Pub. Date: Jul. 18, 2002

(65) Prior Publication Data

US 2004/0161907 A1 Aug. 19, 2004

(30) Foreign Application Priority Data

Jan. 16, 2001 (DE) .......................... 101 01 737

(51) Int. Cl.[7] .............................................. H01L 21/00
(52) U.S. Cl. ........................................ 438/91; 438/141
(58) Field of Search ........................... 438/91, 68, 113, 438/131, 132, 141, 983

(56) References Cited

U.S. PATENT DOCUMENTS

| 4,604,161 A | | 8/1986 | Araghi |
| 4,689,125 A | | 8/1987 | Burrus, Jr. et al. |
| 5,272,114 A | | 12/1993 | van Berkum et al. |
| 5,780,320 A | * | 7/1998 | Kinoshita ..................... 438/33 |
| 5,998,234 A | * | 12/1999 | Murata et al. ................ 438/53 |
| 6,197,609 B1 | * | 3/2001 | Tsutsui et al. ................ 438/33 |
| 6,420,776 B1 | * | 7/2002 | Glenn et al. ................ 257/620 |
| 6,488,021 B1 | * | 12/2002 | Yamane et al. .......... 125/23.01 |

FOREIGN PATENT DOCUMENTS

| DE | 19624677 | 1/1998 |
| JP | 59 090940 A | 5/1984 |
| JP | 02 162750 A | 6/1990 |
| JP | 08 274371 A | 10/1996 |
| JP | 10-064854 | 3/1998 |
| TW | 415036 | 12/2000 |

* cited by examiner

Primary Examiner—David Nhu
(74) Attorney, Agent, or Firm—Cohen, Pontani, Lieberman & Pavane

(57) ABSTRACT

In order to subdivide a wafer (1) into chips, recesses (7) are introduced from a rear side (6), said recesses weakening the wafer (1) at the breaking points. As a result, it is possible to produce chips whose length dimensions are less than twice the thickness of the chips.

11 Claims, 1 Drawing Sheet

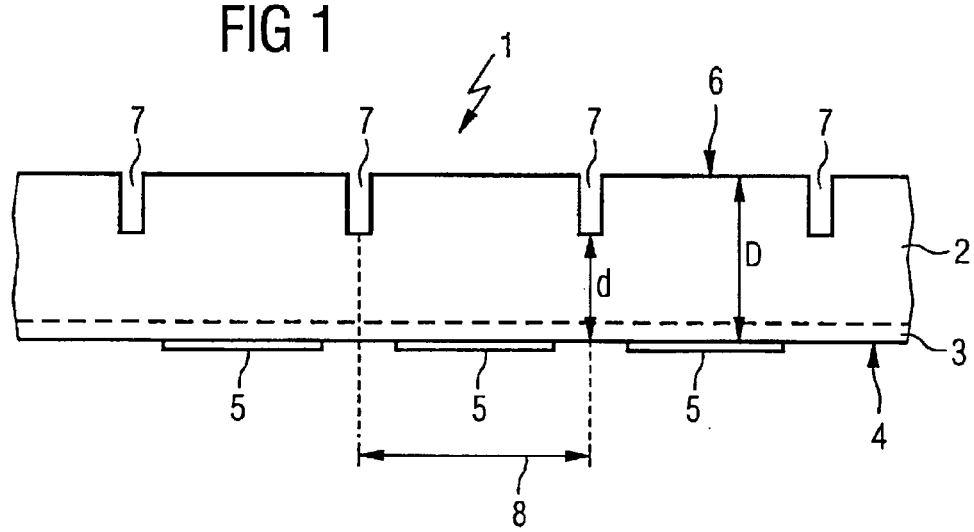
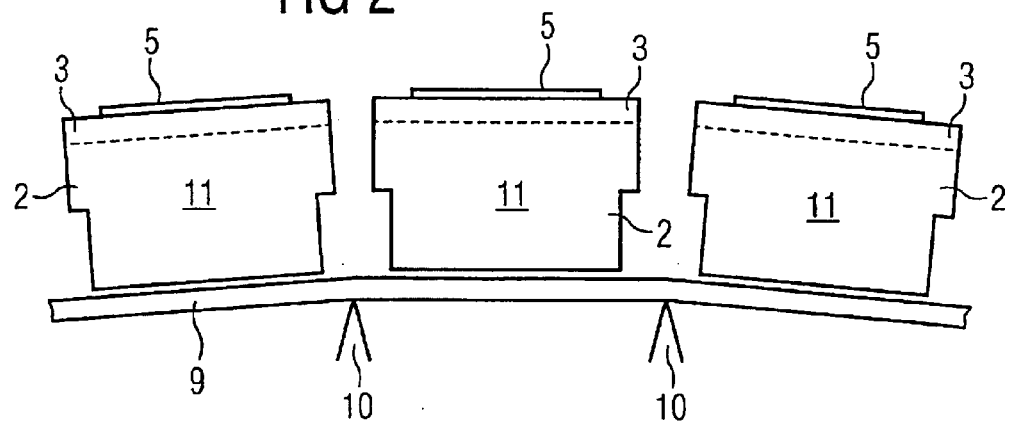

METHOD FOR SUBDIVIDING WAFERS INTO CHIPS

This is a U.S. national stage of International application No. PCT/DE02/00108, filed on 16 Jan. 2002. This patent application claims the priority of German patent application No. 101 01737.5-33, the disclosure content of which is hereby incorporated by reference.

FIELD OF THE INVENTION

The invention relates to a method for subdividing wafers into chips, in which the wafer is firstly weakened along the separation lines and then broken.

BACKGROUND OF THE INVENTION

Methods of this type are generally known. The wafer is usually scribed prior to breaking. This method is particularly advantageous since there is no loss of material associated with the separating operation. However, the loss of material is avoided only when a material-dependent ratio of wafer thickness to edge length of the chip is not undershot. This ratio is about 2–2.5:1 in the case of the compound semiconductors GaAs and InP. If this limit is undershot, rear side breakouts, in particular, occur, which reduces the yield. If the chips are to be miniaturized, the thickness of the chips must therefore be reduced as well. However, commercially available wafers have predetermined thicknesses, so that miniaturization of the length dimensions of the chips is possible only to a limited extent.

SUMMARY OF THE INVENTION

One object of the invention is to provide a separating method by which thick wafers can be singulated into chips having small linear dimensions.

This and other objects are attained in accordance with one aspect to the invention directed to a method for subdividing a wafer into chips, in which the wafer is firstly weakened along separation lines and then broken along the separation lines. A grid dimension of the separation lines is less than twice the thickness D of the wafer. The wafer is provided with recesses the separation lines in such a way that the ratio of grid dimension to the residual thickness of the wafer in the region of the recesses is greater than or equal to 2:1, and wherein the wafer is subsequently broken.

Stated another way, this object is achieved by virtue of the fact tat a grid dimension of the separation lines is less than twice the thickness of the wafer, and that the wafer is provided with recesses along the separation lines and is then broken.

By sawing into the wafer, the thickness of the wafer is brought locally to the permissible dimension. The wafer can then be conventionally scribed further and broken without the risk of breakouts. The method proposed thus enables thick wafers to be subdivided into chips having small length dimensions.

BRIEF DESCRIPTION OF THE INVENTION

The invention is explained in detail below with reference to the accompanying drawings, in which:

FIG. 1 shows a diagrammatic illustration of a cross section through a wafer which has been sawn from the rear side;

FIG. 2 shows a diagrammatic illustration of a cross section through the wafer during the breaking operation.

DETAILED DESCRIPTION OF THE DRAWING

The wafer 1 illustrated diagrammatically in section in FIG. 1 has a substrate 2 and an epitaxial layer 3, which is applied on said substrate 2 and comprises a plurality of successively grown semiconductor layers. The precise layer sequence depends on the functionality respectively envisaged for the epitaxial layer 3. The present method is suitable in particular for application in the production of light-emitting diode chips, in which the epitaxial layer may have, for example, a single heterostructure, a double heterostructure, a single quantum well structure or a multiple quantum well structure. Such light-emitting diode structures are known to the skilled worker in this field and, therefore, are not explained in any further detail at this time.

The thickness of the substrate 2 is typically in the region of 100 $\mu$m. The thickness of the epitaxial layer 3 is typically 10 $\mu$m or less. Contact points 5 are formed on that side of the epitaxial layer 3 which is remote from the substrate 2, this side hereinafter being designated as front side 4. From a rear side 6 of the substrate 2, which is remote from the side of the epitaxial layer 3, slot-like recesses 7 are introduced into the wafer 1 and locally weaken the wafer 1 in such a way that a grid dimension 8 of the recesses 7 is greater than or equal to twice the remaining thickness d of the wafer 1 below the recess 7. Grid dimension is to be understood as the respective distance between the centers of two adjacent recesses 7.

The recesses 7 are expediently produced by being sawn in. However, it should be noted that the recesses 7 can also be formed by other material-removing methods, such as, for example, grinding or cutting with the aid of a laser. It is also conceivable to produce, in place of the slot-type recesses 7, a series of holes arranged at a short distance next to one another.

After the introduction of the recesses 7 on the rear side of the wafer 1, the wafer 1 is applied to a carrier sheet 9 by the substrate side (that is to say the recesses face the carrier sheet 9) and is scribed from the front side 4 in accordance with the grid dimension 8, that is to say perpendicularly opposite the recesses. Following, the wafer 1 is pulled with the carrier sheet 9 over breaking wedges 10 in such a way that the carrier sheet 9 faces the breaking wedges, and is subdivided into individual chips 11 in this way.

This method is advantageous particularly in the subdivision of wafers 1 produced on the basis of III–V compound semiconductors such as, for example, GaAs or InP. The linear dimensions of chips, that is to say the length of the edges of the chips running parallel to the wafer, usually have to be at least twice the thickness of the wafer in order to ensure a separating operation that is free from faults to the greatest possible extent.

In this case, the term linear dimensions is to be understood to be the grid dimensions 8 of the wafer 1, that is to say the width or length of the chips 11 produced from the wafer. The method described here can also be used to subdivide wafers 1 into chips 11 in which the linear dimensions are less than twice the thickness D of the wafer 1. These large thicknesses D in relation to the chip size also give rise to only low losses through faults, in particular rear side breakouts, during the separating operation.

A method according to the invention was used for example to subdivide a wafer 1 into chips 11 in which there was a ratio of linear dimension to thickness D of the wafer 1 of 1.66:1. The loss of yield during the separating process was less than 0.5% in this case. By contrast, the loss of yield was 15–20% without the application of the sawing slots 7.

The scope of protection of the invention is not limited to the examples given hereinabove. The invention is embodied in each novel characteristic and each combination of characteristics, which particularly includes every combination of any features which are stated in the claims, even if this combination of features is not explicitly stated in the claims.

We claim:

1. A method for subdividing a wafer (1) into chips (11), in which the wafer (1) is firstly weakened along separation lines and then broken along the separation lines, wherein a grid dimension (8) of the separation lines is less than twice a thickness D of the wafer (1) and wherein the wafer (1) is provided with recesses (7) along the separation lines in such a way that a ratio of grid dimension to a residual thickness of the wafer in a region of the recesses (7) is greater than or equal to 2:1, and wherein the wafer is subsequently broken.

2. The method as claimed in claim 1, wherein the recesses (7) are produced by being sawn in.

3. The method as claimed in claim 1, wherein prior to subdivision, the wafer (1) is provided with an epitaxial layer (3).

4. The method as claimed in claim 3, wherein the wafer (1) is sawn from that side of the wafer (1) which is opposite to the epitaxial layer (3).

5. The method as claimed in claim 3, wherein prior to breaking, the wafer (1) is scribed from the front side provided with the epitaxial layer (3).

6. The method as claimed in claim 1, wherein prior to breaking, the wafer (1) is applied to a carrier sheet (9) in such a way that the recesses (7) face toward to the carrier sheet (9).

7. The method as claimed in claim 6, wherein the wafer (1) is pulled with the carrier sheet (9) over a breaking wedge (10) such that opposite walls of the recesses (7) are pressed toward each other and the separating crack starts on the side of the wafer (1) that is opposite to the recesses (7).

8. The method as claimed in claim 3, wherein the epitaxial layer (3) is produced on the basis of a III–V compound semiconductor material.

9. The method as claimed in claim 8, wherein the epitaxial layer (3) is produced on the basis of GaAs or InP.

10. The method as claimed in claim 1, wherein breaking areas running along the separating lines are mirror areas of a laser resonator.

11. The method as claimed in claim 3, wherein the epitaxial layer (3) has light-emitting diode structures.

* * * * *